United States Patent [19]
Nishi

[11] Patent Number: 5,505,577
[45] Date of Patent: *Apr. 9, 1996

[54] TRANSFER APPARATUS

[75] Inventor: Mitsuo Nishi, Kumamoto, Japan

[73] Assignees: Tokyo Electron Limited, Tokyo; Tokyo Electron Kyushu Limited, Tosu, both of Japan

[*] Notice: The term of this patent shall not extend beyond the expiration date of Pat. No. 5,374,153.

[21] Appl. No.: 312,080

[22] Filed: Sep. 26, 1994

Related U.S. Application Data

[63] Continuation-in-part of Ser. No. 140,985, Oct. 25, 1993, Pat. No. 5,374,153, which is a continuation of Ser. No. 787,663, Nov. 4, 1991, abandoned.

[30] Foreign Application Priority Data

Nov. 17, 1990 [JP] Japan ................... 2-312478

[51] Int. Cl.⁶ ......................................... B65G 65/00
[52] U.S. Cl. ..................... 414/417; 414/404; 414/938; 118/500
[58] Field of Search ...................... 414/404, 416, 414/417, 222, 217, 935, 337, 938, 940, 941, 744.2, 744.5, 744.3; 118/719, 500; 204/298.25

[56] References Cited

U.S. PATENT DOCUMENTS 4,806,057  2/1989  Cay et al. .................. 414/225
5,007,788  4/1991  Asano et al. ............... 414/417
5,125,784  6/1992  Asano ......................... 414/404
5,188,136  2/1993  Kumagai .

FOREIGN PATENT DOCUMENTS 236714  6/1986  Germany ................ 414/416
48442   2/1989  Japan ..................... 414/404
255242  10/1989 Japan ..................... 414/404

Primary Examiner—Frank E. Werner
Attorney, Agent, or Firm—Oblon, Spivak, McClelland, Maier & Neustadt

[57] ABSTRACT

A transfer apparatus comprising a carrier table for arranging a plurality of the carriers arranged in a serial array so as to hold the substrates mutually parallel to each other, a plurality of push-up members being adapted to be moved below each of the carriers for pushing up the substrates supported on the carriers through a lower opening portion of each of the carriers and having an upper surface with a plurality of equidistantly spaced grooves for receiving and lifting all of the substrates supported in one carrier as a whole, devices for bringing at least one of the plurality of push-up members into proximity to a corresponding remaining push-up member to allow the at least one push-up member to face the corresponding push-up member so that their mutually adjacent, directly-facing endmost substrates held in an endmost grooves of the mutually adjacent, directly-facing push-up members have their mutual distance adjusted to a distance equal to a pitch distance of those substrates supported by the push-up member to transfer the substrates to a support member.

7 Claims, 13 Drawing Sheets

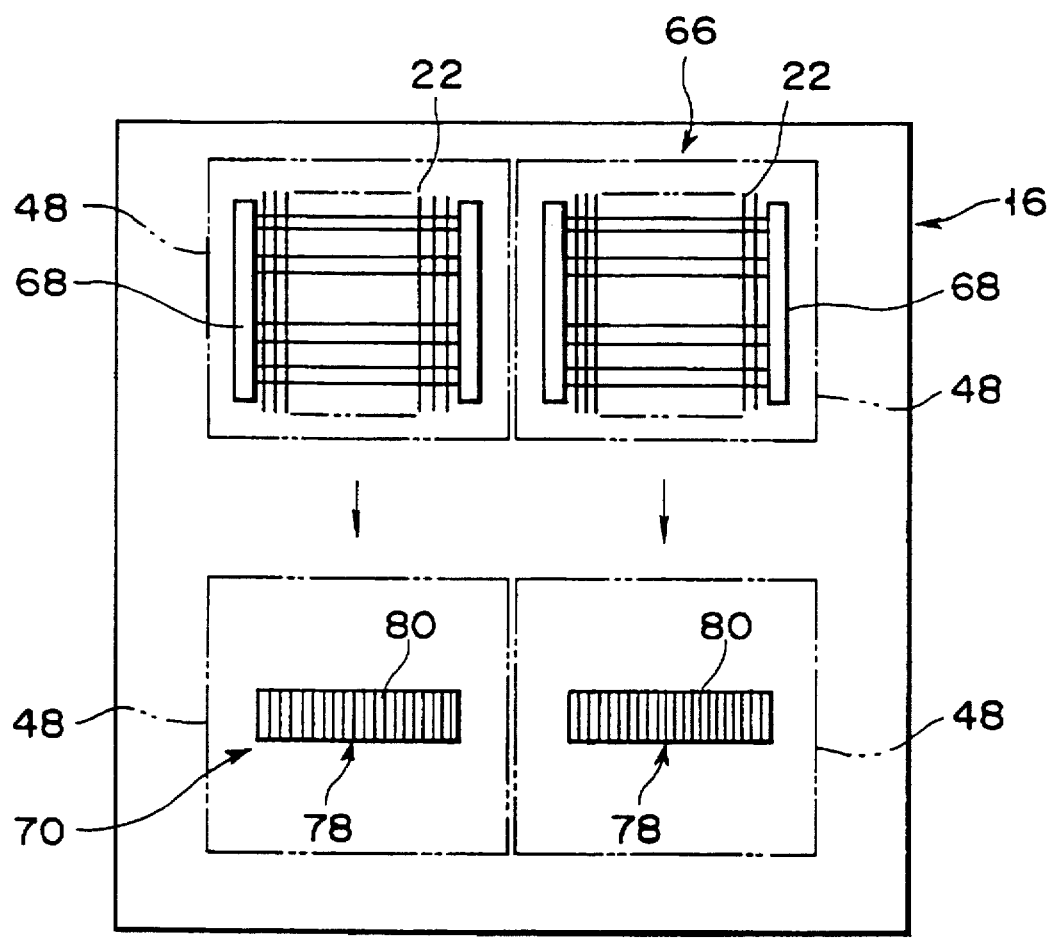
F I G. 2

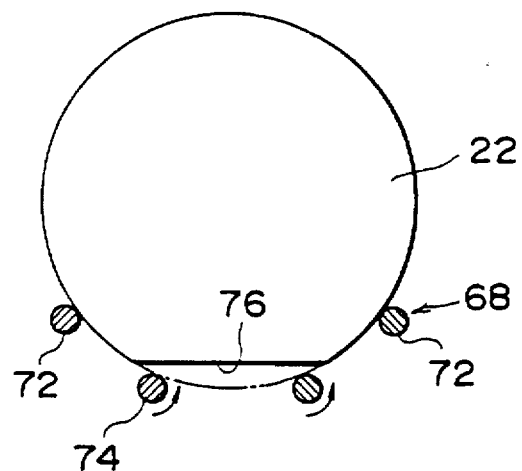
F I G. 3
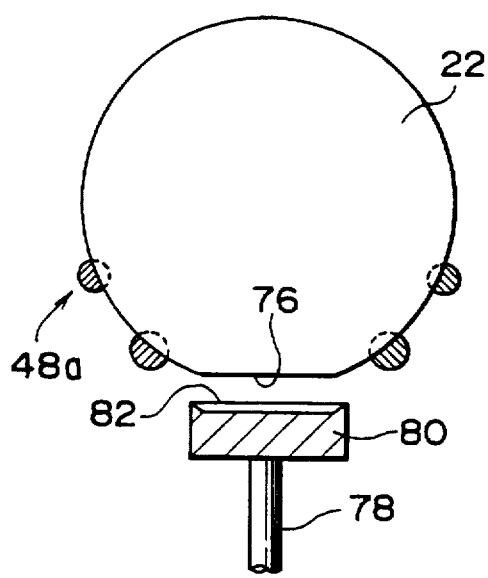
F I G. 4A
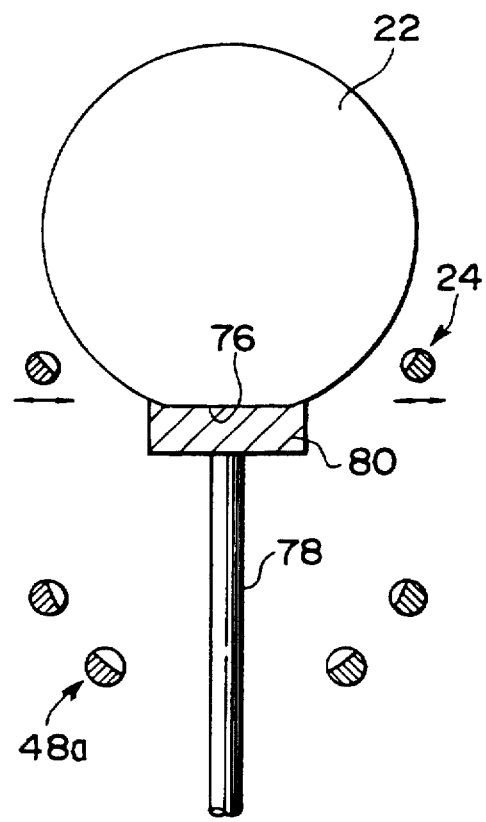
F I G. 4B

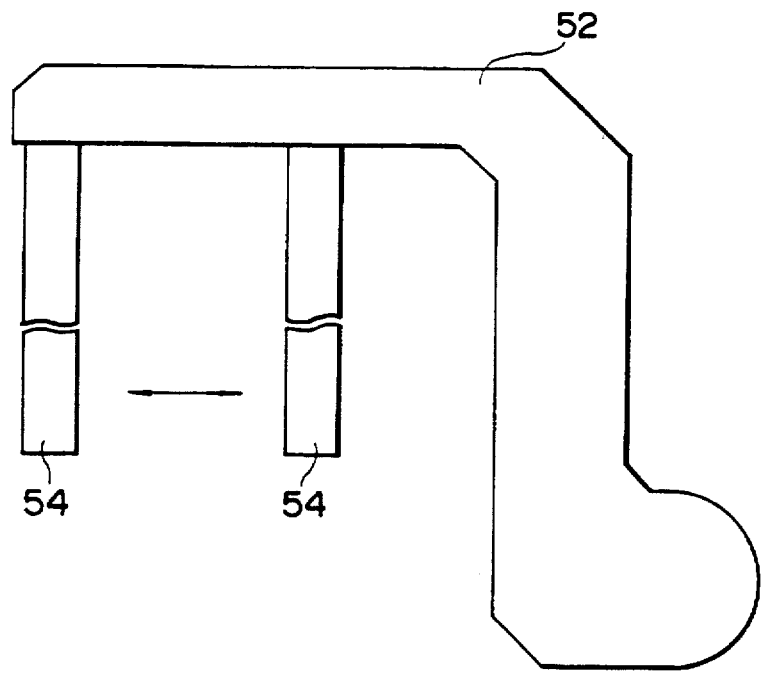
FIG. 10A
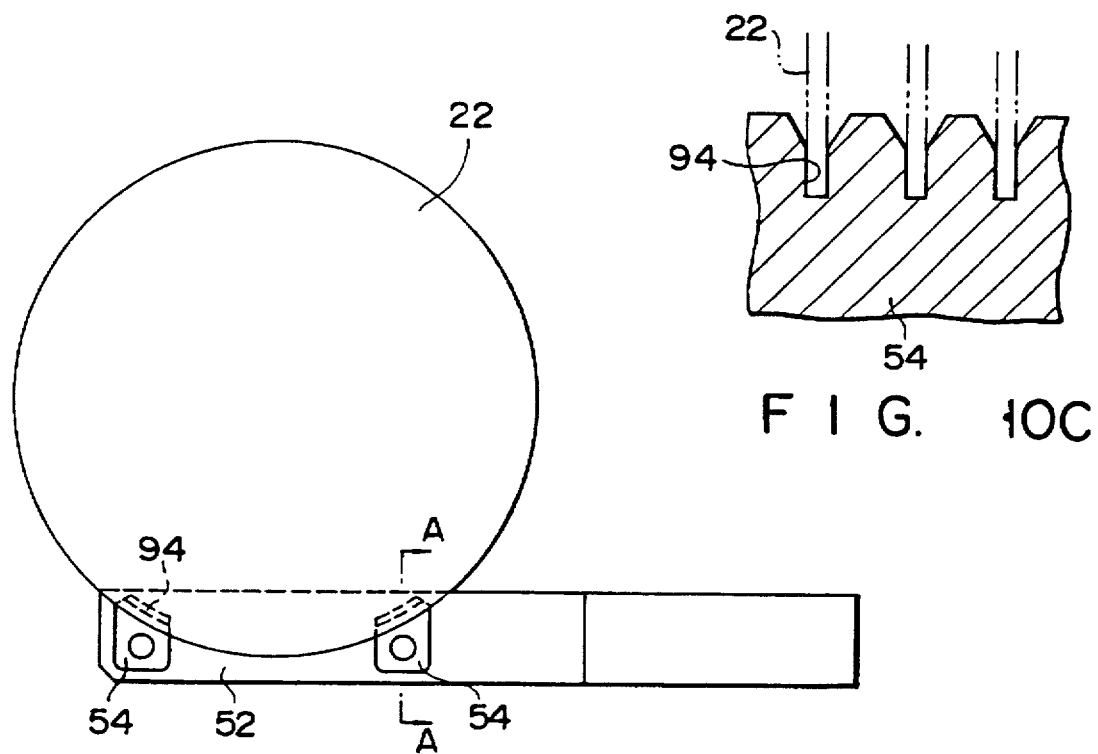
FIG. 10B
FIG. 10C

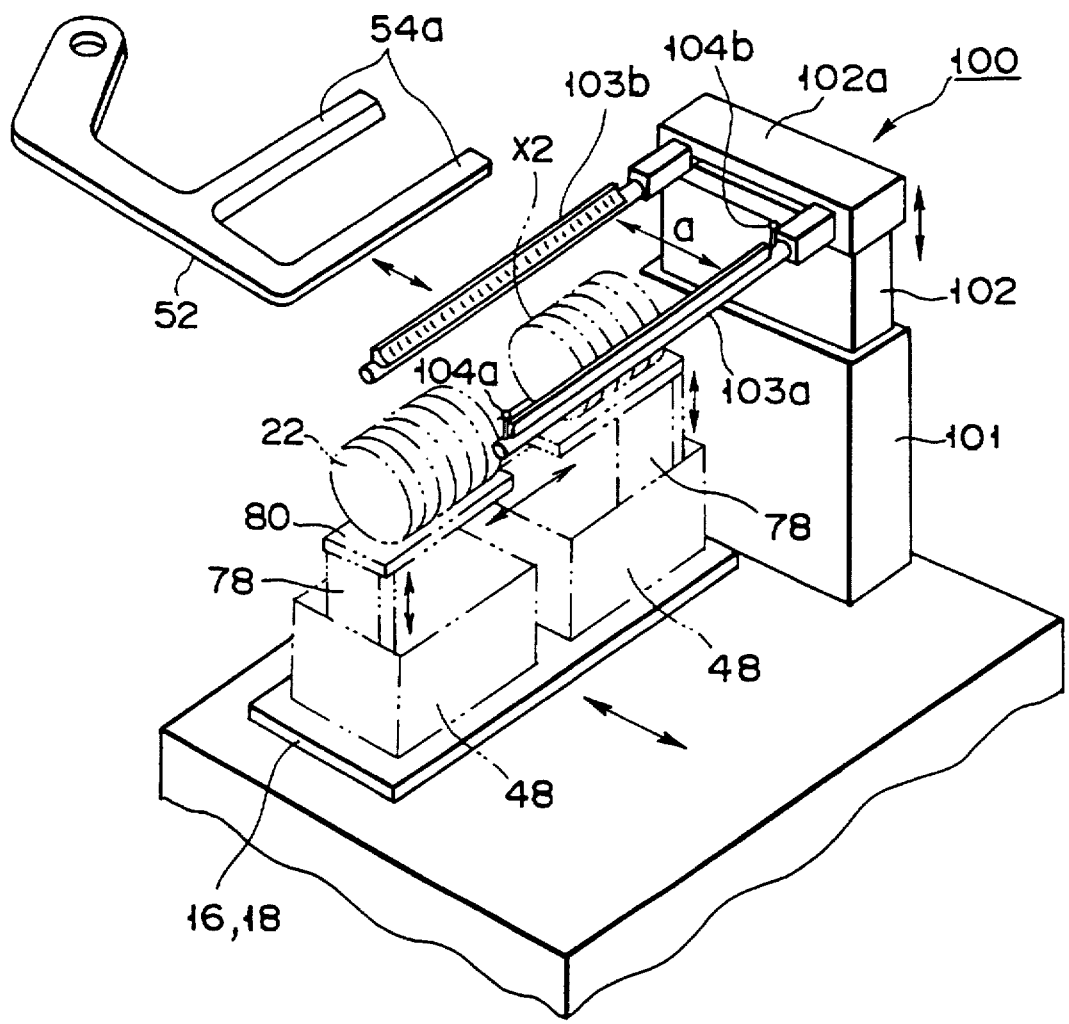
F I G. 12

5,505,577

TRANSFER APPARATUS

CROSS-REFERENCES TO THE RELATED APPLICATIONS

This application is a continuation-in-part application of U.S. patent application Ser. No. 08/140,985 (filed on Oct. 25, 1993), which is a file wrapper continuation application of Ser. No. 07/787,663, filed on Nov. 4, 1991.

BACKGROUND OF THE INVENTION

1. Field of the Invention

The present invention relates to a transfer apparatus for transferring a number of objects arranged on a carrier onto another support member.

2. Description of the Related Art

Conventionally, a semiconductor wafer transfer apparatus for transferring a number of objects, e.g. semiconductor wafers, onto another support member at a time has been employed in a semiconductor manufacturing apparatus such as a heat treatment apparatus or a washing apparatus.

In this conventional semiconductor wafer transfer apparatus, for example, 25 semiconductor wafers contained in a single carrier are pushed up by a push-up member, and the 25 wafers in the single carrier are chucked by a chuck situated on the upper side. The chucked wafers are transferred.

In the conventional semiconductor wafer transfer apparatus, there is no other choice but to transfer semiconductor wafers in units of, e.g. 25, in each carrier. However, in a heat treatment process, semiconductor wafers of, e.g. four carriers can be batch-treated at a time; in a washing process, wafers of, e.g. two carriers can be batch-treated at a time. Thus, in order to transfer the wafers for a single batch-treatment, it is necessary to repeat the wafer transfer operation a number of times corresponding to the number of carriers containing the wafers to be subjected to the batch-treatment. As a result, the time necessary for the transfer is increased and the treatment throughput is decreased.

SUMMARY OF THE INVENTION

The object of the present invention is to provide a transfer apparatus by which the time for transfer can be reduced.

Specifically, this invention aims at providing a transfer apparatus capable of transferring objects on a plurality of carriers at a time.

This object can be achieved by the transfer apparatus of the present invention described below.

According to one aspect of the present invention, there is provided a transfer apparatus for transferring a plurality of substrates between carriers holding these equidistantly arranged substrates thereon and a support member, comprising:

a carrier table for arranging a plurality of the carriers arranged in a serial array so as to hold the substrates mutually parallel to each other;

a plurality of push-up members, each of the push-up members being adapted to be moved below each of the carriers for pushing up the substrates supported on the carriers through a lower opening portion of each of the carriers, each of the push-up members having an upper surface with a plurality of equidistantly spaced grooves for receiving and lifting all of the substrates supported in one carrier as a whole;

driving means for bringing at least one of the plurality of push-up members into proximity to a corresponding remaining push-up member to allow the at least one push-up member to face the corresponding push-up member so that their mutually adjacent, directly-facing endmost substrates held in an endmost grooves of the mutually adjacent, directly-facing push-up members have their mutual distance adjusted to a distance equal to a pitch distance of those wafers supported by the push-up member, wherein all the substrates lifted up by the plurality of the push-up members and mutually equidistantly arranged are transferred at a time from the push-up members to the support member.

According to another aspect of the present invention, there is provided a transfer apparatus for transferring a plurality of substrates between carriers holding these substrates in an equidistant array and a support member, comprising:

a carrier table for arranging a plurality of the carriers arranged in serial array so as to hold the substrates mutually parallel to each other;

elevator means for allowing the carriers to be lowered together with the carrier table; and a receiving member having an upper surface with a plurality of equidistantly formed grooves thereon so that, when the carrier is lowered by the elevator means, the receiving member receives all of the substrates from the respective carriers at a time, wherein all of the mutually equidistantly arranged substrates are transferred to the support member at a time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a plan view showing a semiconductor wafer transfer apparatus in a loader section shown in FIG. 1;

FIG. 3 is an orientation-flat aligning mechanism shown in FIG. 2;

FIGS. 4A and 4B are cross-sectional views showing the state of operation of a push-up mechanism shown in FIG. 2;

FIG. 10A is a plan view of a wafer fork, FIG. 10B is a side view thereof, and FIG. 10C is a cross-sectional view taken along line A—A in FIG. 10B;

FIG. 12 is a perspective view of a semiconductor wafer transfer apparatus according to another embodiment of the invention;

DETAILED DESCRIPTION OF THE PREFERRED EMBODIMENTS

Embodiments of the present invention, in which a transfer apparatus of the invention has been applied to a washing apparatus in a semiconductor wafer manufacturing apparatus, will now be described with reference to the accompanying drawings.

Figure 1:
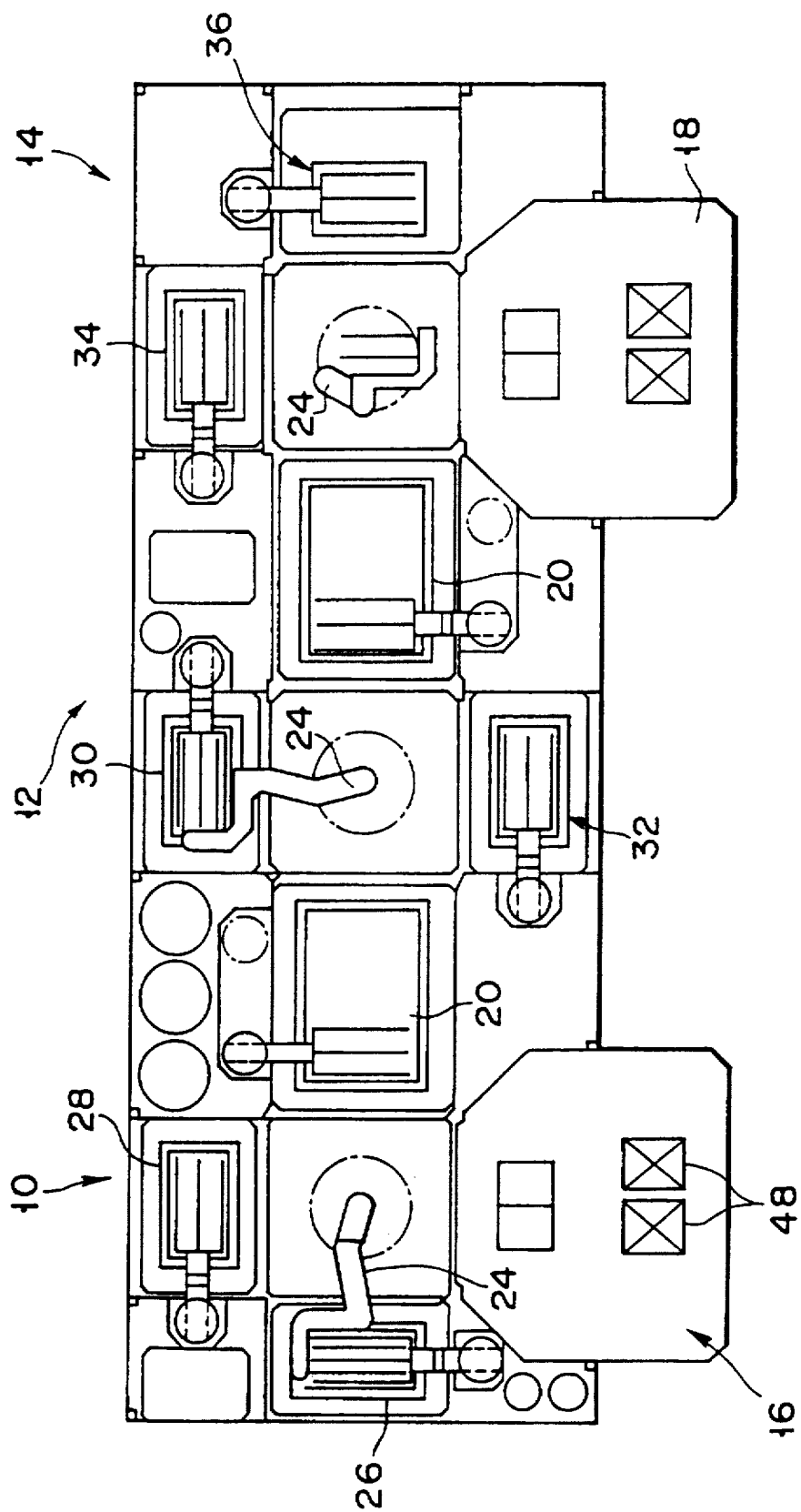
FIG. 1 is a plan view showing an overall structure of an embodiment of the present invention, in which a transfer apparatus according to the invention has been applied to a washing apparatus in a semiconductor wafer manufacturing apparatus.

FIG. 1 shows a semiconductor wafer washing apparatus according to an embodiment of the invention. The apparatus comprises three washing treatment units 10, 12 and 14. The wafer-receiving side treatment unit 10 is coupled to a loader 16 serving as a carrier table, and the wafer-discharge side treatment unit 14 is coupled to an unloader 18 serving as a carrier table. Underwater loaders 20 included in any of the three units are provided, respectively, between the washing treatment units 10 and 12 and between the treatment units 12 and 14.

The unit 10 is constructed such that a rotary transfer arm 24 for transferring semiconductor wafers 22 is situated at a center part of the unit 10. In addition, two washing treatment baths 26 and 28 are arranged around the arm 24; bath 28 being on the front side of the loader 16, and bath 26 being on the left of the arm 24. In the present embodiment, the washing treatment bath 26 is employed as a chemical treatment bath for ammonia treatment, and the bath 28 is employed as a quick-damp-rinse (QDR) treatment bath for water-rinse treatment.

The intermediate washing treatment unit 12 has a rotary transfer arm 24 at its center area. The underwater loaders 20 are situated on the right and left sides of the arm 24, and two washing treatment baths 30 and 32 are arranged in front of and in rear of the arm 24. In the present embodiment, the washing treatment bath 30 is employed as a chemical treatment bath for hydrofluoric acid, and the bath 32 is employed as a water rinse over-flow treatment bath.

The discharge-side washing treatment unit 14 has a rotary transfer arm 24 at its center area. A washing treatment bath 34 is situated on the front side of the unloader 18, and a dry treatment bath 36 is provided on the right side of the arm 24. In this embodiment, the treatment bath 34 is employed as a final water rinse bath.

Figure 8:
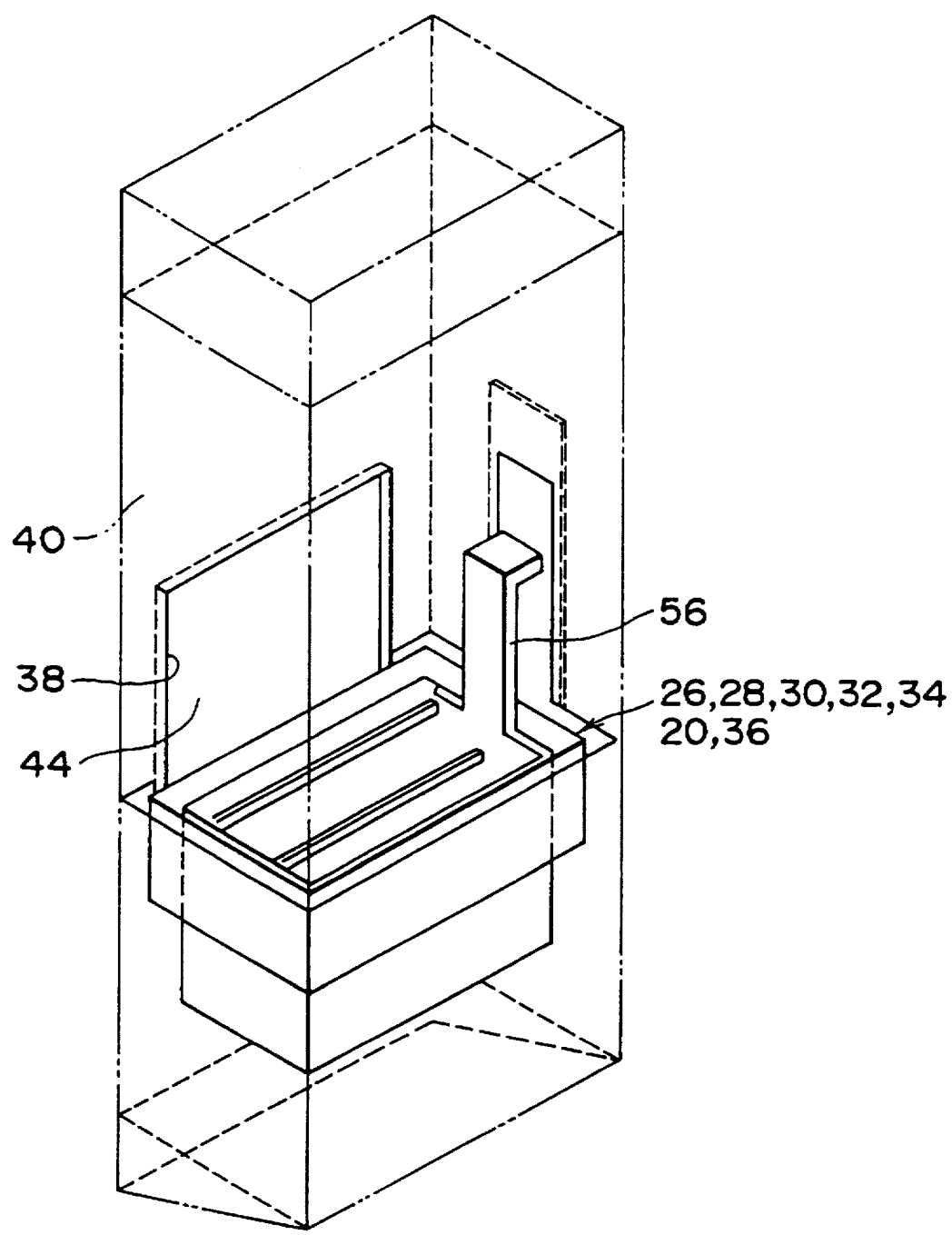
FIG. 8 is a perspective view showing the state of a washing treatment bath.

The washing treatment baths 26, 28, 30, 32 and 34, the underloaders 20 and the dry treatment bath 36 are housed in a casing 40, as shown in FIG. 8. The casing 40 has an opening 38 for receiving/discharging semiconductor wafers 22.

As is shown in FIG. 2, a semiconductor wafer transfer apparatus 66 is provided on the loader 16.

The transfer apparatus 66 comprises a plurality of (two in this embodiment) carriers 48, orientation-flat ("ori-fla") aligning mechanisms 68, a push-up mechanism 70 and the above-mentioned rotary transfer arm 24.

Each of the two carriers 48 comprises a frame member having four rod members 48a. The rod members 48a are distanced in parallel to each other so as to support lower portions of the semiconductor wafers 22 which are in the erected state. A plurality of (e.g. 25) semiconductor wafers 22 are placed equidistantly on each carrier 48. The wafers 22 are conveyed from the prior-stage device onto the loader 16 in units of two. The two carriers 48 are arranged on the loader 16 with a slight distance therebetween to prevent their mutual contact.

Two ori-fla aligning mechanisms 68 are provided to correspond to the two carriers 48. As is shown in FIG. 3, each ori-fla aligning mechanism 68 comprises two upper guide rods 72, which are in contact with the peripheral surfaces of wafers 22, and two lower rotary shafts 74. The lower parts of the 25 semiconductor wafers 22 on each carrier 48 are brought into contact with the guide rods 72 and rotary shafts 74, and the rotary shafts 74 are rotated for a predetermined time period. When orientation-flats 76 of the wafers 22 are situated at the lower position, they become out of contact with the rotary shafts 74. In this position, the wafers 22 are aligned.

The push up mechanism 70 pushes up and supports the semiconductor wafers 22 on the two carriers 48 from the inside of the carriers 48 through a bottom opening of the carriers 48. The push-up mechanism 70 gathers the wafers 22. The push-up mechanism 70 comprises two push-up rods 78 associated with the carriers 48, and a driving mechanism (not shown) for moving the push up rods 78 vertically and horizontally.

Figure 5:
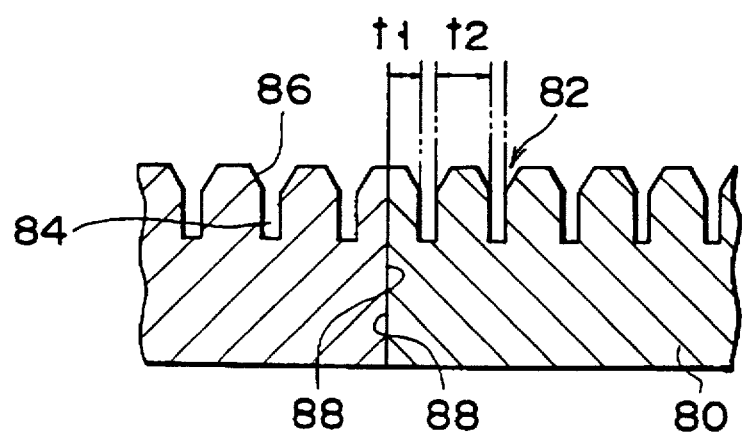
FIG. 5 is a vertical-cross-sectional view showing the state of the push-up members shown in FIG. 4B, which are brought into contact with each other.

Each push-up rod 78 has a push-up member 80 with a length slightly greater than the length of the 25 semiconductor wafers 22 along the axis along which the wafers 22 are arranged equidistantly on the corresponding carrier 48. Twenty-five (25) semiconductor wafer support grooves 82 for receiving and supporting the lower end portions of the wafers 22 on the carrier 48 are formed equidistantly in the upper surface of the push-up member 80 (see FIG. 4A or FIG. 5). As is shown in FIG. 5, each semiconductor wafer support groove 82 has a support portion 84 corresponding to the thickness of each semiconductor wafer 22, and a flared insertion guide portion 86 is formed at an upper part of the support portion 84. Thereby, the semiconductor wafers 22 can smoothly be inserted in the grooves 82.

The push-up member 80 is designed such that a distance t1 between an adjoining end portion 88 of the push-up member 80 and a surface of the semiconductor wafer 22 situated in the support portion 84 near the end portion 88 is half the distance t2 between the adjacent semiconductor wafers 22. Thereby, when the push-up rods 78 are approached to each other to gather the semiconductor wafers 22, the distance between the semiconductor wafers 22 situated at the adjoining end portions of the two push up members 80 coincides with the distance t2 between other adjacent wafers 22. Thus, all semiconductor wafers 22 can be arranged equidistantly.

Figure 6:
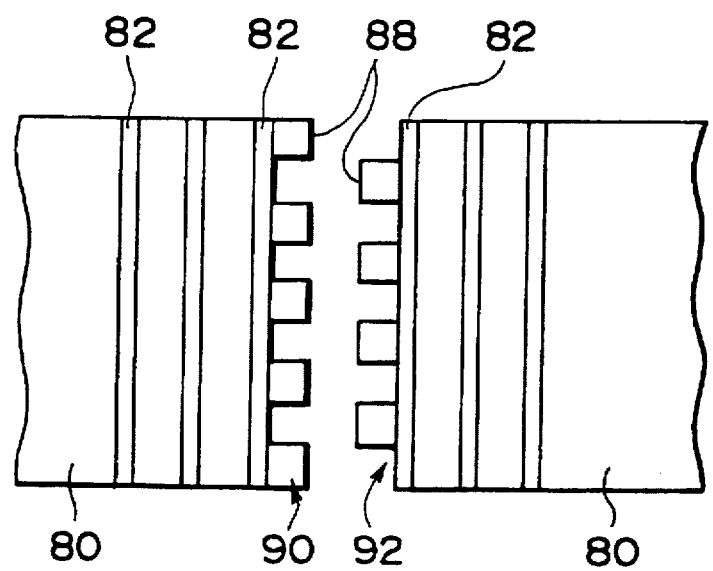
FIG. 6 is a plan view showing the state of the mutually adjoining end portions of the push-up members.

Alternatively, as shown in FIG. 6, the adjoining end portions 88 of the two push up members 80 are provided with ridges and grooves 90 and 92 which are meshed with one another, thereby reinforcing the end portions 88.

The unloader 18 has substantially the same mechanism as the loader 16. The semiconductor wafers 22 are returned by the unloader 18 to the carriers 48 in a reverse order.

Figure 7:
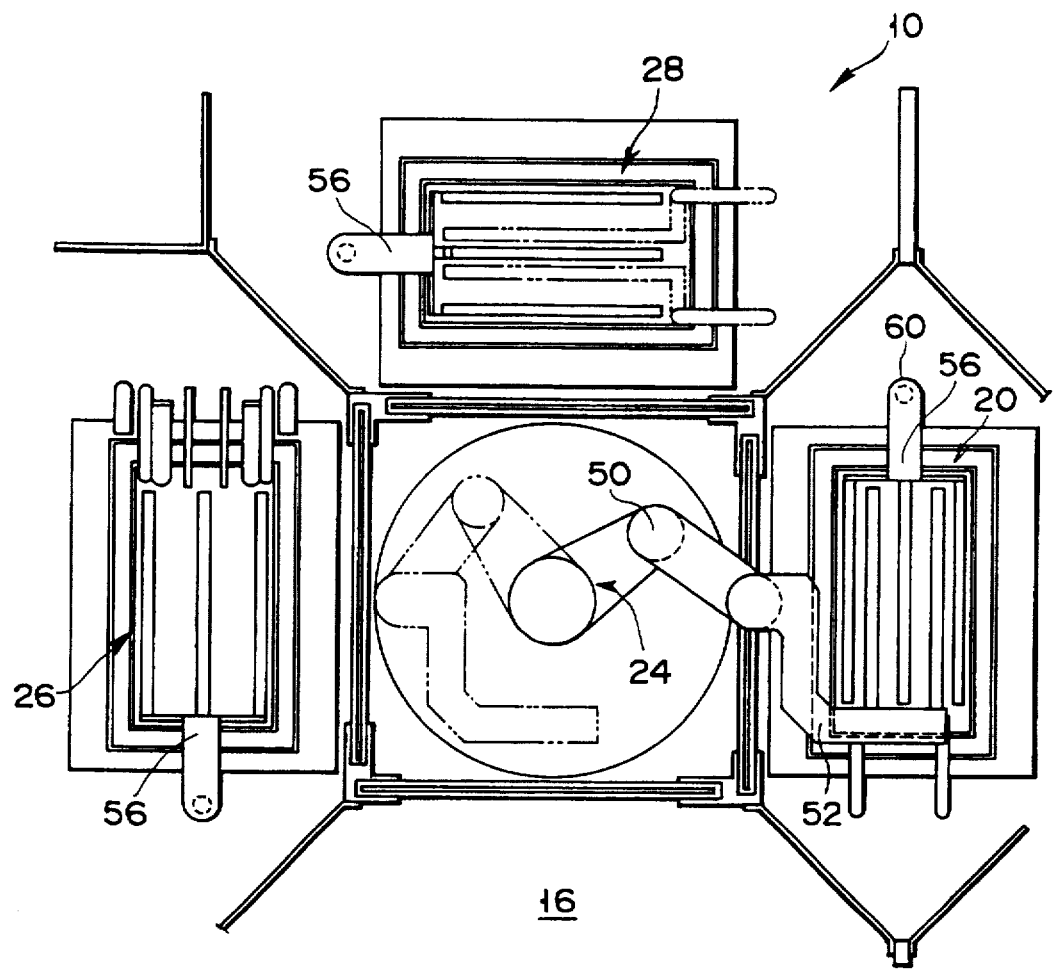
FIG. 7 is an enlarged view showing a washing treatment unit on the wafer-receiving side in FIG. 1.

As is shown in FIG. 7, the rotary transfer arm 24 supports 50 semiconductor wafers 22 supported on the push up rods 78 of the push-up mechanism 70 by lifting the wafers 22 from the lower side thereof. Then, the wafers 22 are transferred to a desired position. The arm 24 comprises an extendible multi-joint arm body 50 and a wafer fork 52 for supporting the wafers 22. The wafer fork 52 has two parallel support arms 54, as shown in FIGS. 10A and 10C. The arms 54 are horizontally movable. Each arm 54 has equidistant 50 support grooves 94 for aligning semiconductor wafers 22. While the support arms 54 are moved away from each other, the arms 54 are situated under the push-up rods 78 supporting the semiconductor wafers 22. The distance between the support arms 54 is narrowed and the push-up rods 78 are lowered. Thereby, 50 wafers 22 are placed on the arms 54.

Figure 9:
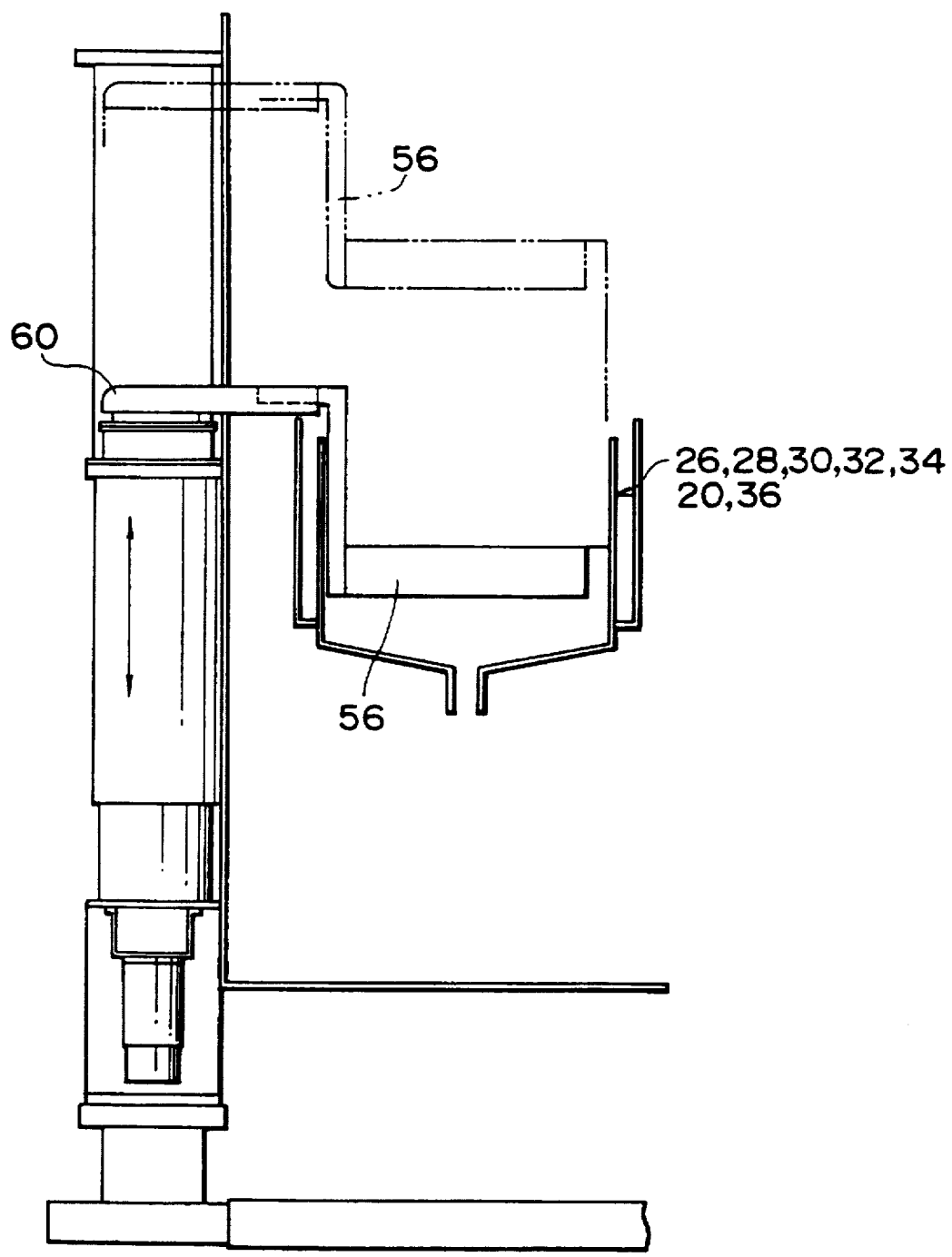
FIG. 9 is a side view showing a boat and an arm.
Figure 11A:
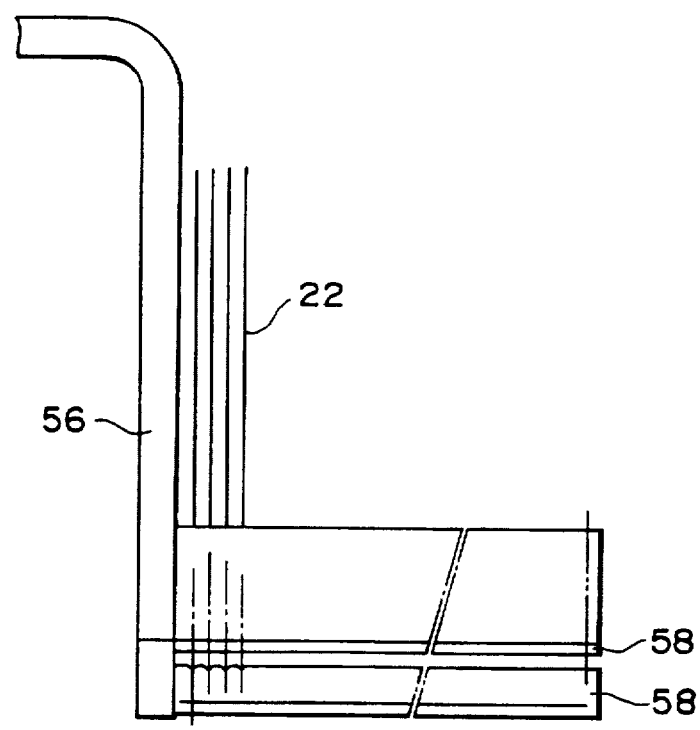
FIG. 11A is a side view of a boat.
Figure 11B:
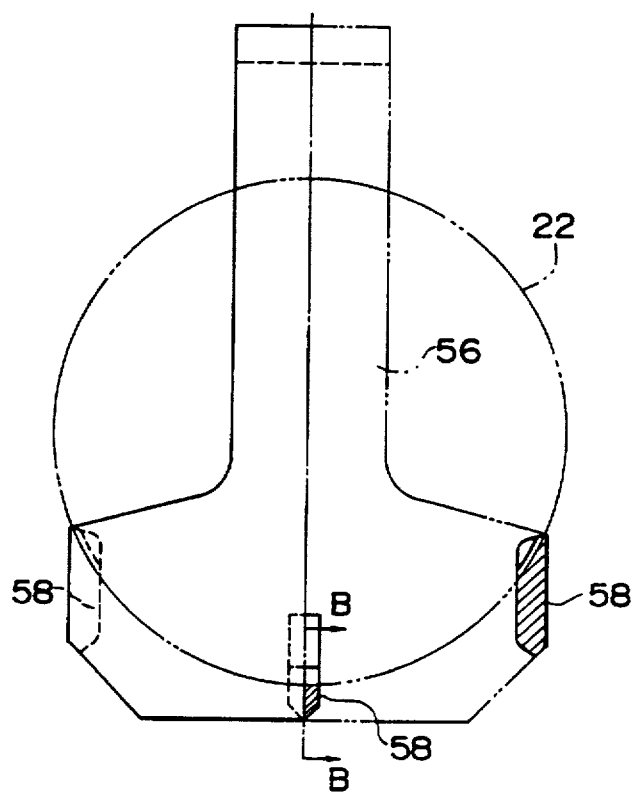
FIG. 11B is a front view thereof.
Figure 11C:
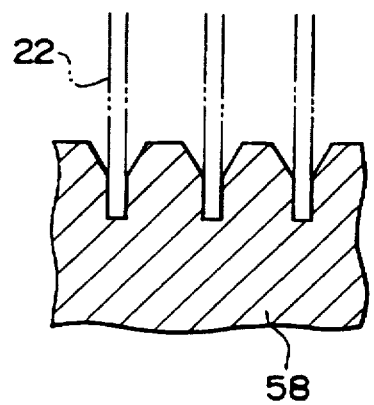
FIG. 11C is a cross-sectional view taken along line B—B in FIG. 11B.

The rotary transfer arm 24 receives semiconductor wafers 22 from the loader 24. In addition, the arm 24 transfers and receives the wafers 22 in association with the washing treatment baths 26, 28, 30, 32 and 34, underwater loaders 20, dry treatment bath 36 and unloader 18. Specifically, in association with the underwater loader 20, washing treatment baths 26, 28, 30, 32 and 34 and dry treatment bath 36, boat 56 provided for each bath is vertically moved, as shown in FIG. 9, thus enabling the arm 24 to receive the wafers 22 from the boat 56 and transfer the wafers 22 to the boat 56. As is shown in FIGS. 11A to 11C, the boat 56 has a support rod 58 having grooves for supporting the wafers 22. The support rod 58 is designed such that the rod 58 does not interfere with the support arms 54 of the wafer fork 52 when it is vertically moved.

The operation of the present embodiment will now be described.

Two carriers 48, each supporting 25 semiconductor wafers 22, are conveyed to the loader 16. The ori-fla aligning mechanism 68 is operated, as shown in FIG. 3, to align the orientation flats of the wafers 22 in the carriers 48. Thus, the wafers 22 are aligned. In this case, the ori-fla aligning mechanism 68 moves the guide rods 72 and rotary shafts 74 from below the carriers 48, thus bringing the rods 72 and shafts 74 into contact with the wafers 22. Then, by rotating the wafers 22 for predetermined time period, the oriental-flat alignment is carried out.

The carriers 48 are moved by the loader 16 to a location above the push-up rods 78. The push-up mechanism 70 moves up the push up rods 78. While the position of the carriers 48 is unchanged, the push-up rods 78 push up and support the semiconductor wafers 22 through the bottom opening of the carriers 48.

Thereafter, the push-up rods 78 are brought into contact with each other by the push-up mechanism 70. Alternatively, only one of the rods 78 moves towards the other, whereby both are brought into contact. Thus, 50 semiconductor wafers 22 are arranged equidistantly. In this case, as shown in FIG. 5, the distance t1 between the adjoining end portion 88 of the push-up member 80 and a surface of the semiconductor wafer 22 situated at the end portion 88 is half the distance t2 between other adjacent semiconductor wafers 22. Alternatively, the end portions 88 of the push up members 80 are provided with ridges and grooves. When the push-up members 80 are brought into contact with each other, all semiconductor wafers 22 are arranged equidistantly.

In the present embodiment, since the shape of the push-up member 80 is designed, as shown in FIG. 5 or 6, the pitch of the wafers 22 can be made constant after the push-up members 80 are brought into contact; however, the pitch is not necessarily be set to be constant. In particular, in the washing treatment, a variance in pitch does not considerably affect the uniformity in treatment. However, in the case where the pitch between wafers considerably affects the uniformity in treatment, e.g. in a plasma CVD process, the structure of FIG. 5 or 6 is desirable.

Subsequently, the rotary transfer arm 24 is rotated horizontally, and the support arms 54 of wafer fork 52, while the distance between arms 54 is widened, are extended towards the push-up rods 78. The wafer fork 52 at the distal end of the arm 24 is situated under the push-up rods 78. The distance between the arms 54 is narrowed. The push-up rods 78 are lowered. As a result, the semiconductor wafers 22 are fitted in the grooves 94 of the support arms 54 and are aligned on the wafer fork 52.

While the wafers 22 are placed on the wafer fork 52, the rotary transfer arm 24 is rotated horizontally and the wafers 22 are situated above the washing treatment bath 26. In this state, the wafers 22 are fitted in the grooves of the support rod 58 and are aligned on the boat 56 of the bath 26. Then, the washing treatment is started.

After the washing treatment, the semiconductor wafers 22 on the boat 56 are brought onto the support arms 54 of the wafer fork 52 of rotary transfer arm 24 according to the process reverse to the above. The wafers 22 are taken out of the casing 40 of the bath 26. The wafers 22 are transferred to the next washing treatment bath 28.

After the washing treatment in the wafer-receiving side washing treatment unit 10 is finished, the wafers 22 are brought to the intermediate washing treatment unit 12 via the underwater loader 20. Further, the wafers 22 are transferred to the discharge-side washing treatment unit 14 via the washing treatment units 30 and 32 and underwater loader 56. Then, the wafers 22 are transferred to the unloader 18 via the washing treatment bath 34 and dry treatment bath 36. By performing the same operations as in the case of the loader 16 in the reverse order, the 50 wafers 22 are divided into two units of 25 wafers, and the orientation-flat alignment is carried out. The two units of wafers 22 are placed on the two carries 48 and are conveyed out.

In the above embodiment, the three treatment units 10, 12 and 14 are combined; however, the number of units combined is freely chosen.

The number of semiconductor wafers 22 supported on one carrier is not limited to 25.

In the above embodiment, the semiconductor wafer 22 of two carriers are transferred at a time; however, it is obvious that the semiconductor wafers of three or more carriers can be transferred at a time.

FIG. 12 shows another embodiment of the present invention. The main difference between the preceding embodiment and this embodiment is as follows. In this preceding embodiment the semiconductor wafers 22 are directly lifted by the support arms 54 of the rotary positioning arm 24 from the push-up members 80 and then the wafers 22 are transferred to the treatment device. By contrast, in this embodiment the semiconductor wafers 22 are temporarily lifted from the push-up members 80 by vertically movable support means provided on one of the loader 16 and unloader 18, and the wafers 22 are taken from the support means by the rotary positioning arm 24 and brought to the treatment device.

The common parts between these embodiments are denoted by like reference numerals, and a detailed description thereof is omitted.

The support means 100, which is provided vertically movably on one of loader 16 and unloader 18, as mentioned above, comprises mainly an elevator 102 which can be vertically moved by drive means (not shown) within a box 101, and a pair of support arms 103a and 103b having grooves. The support arms 103a and 103b extend from a top portion 102a of the elevator 102 in parallel to the push-up members 80.

The support arms 103a and 103b are moved towards and away from each other in the directions indicated by a double-headed arrow a by means of a motor (not shown) provided in the top portion 102a of the elevator 102. One support arm 103a has at its end an optical sensor constituted by light emitting means 104a and light receiving means 104b. The optical sensor detects whether semiconductor sensors 22 are received by the support arms 103a and 103b.

The support arms 103a and 103b are exposed to a chemical atmosphere; thus, it is desirable that the arms 103a and 103b be made of a material having a high resistance to chemicals, causing no damage to semiconductor wafers 22, and having a low frictional coefficient: for example, fluorine-contained resin such as Teflon, or polyether-ether-keton.

The operation of this embodiment will now be described.

As in the first embodiment, two carriers 48, each supporting 25 semiconductor wafers 22, are conveyed onto the loader 16. Oriental-flat alignment is carried out by the ori-fla aligning mechanism 68. The carriers 48 are moved to a location above the push-up members 80 by the loader 16. The push-up rods 78 rise and enable the push-up members 80 to lift and support the semiconductor wafers 22 within the carriers 48 through the bottom openings of the carriers 48.

Subsequently, as in the first embodiment, the push-up rods 78 approach each other and their ends are abutted on each other. Thus, the 50 semiconductor wafers 22 are arranged equidistantly.

While the support arms 103a and 103b with grooves are distanced suitably, they are lowered and situated near both sides of the push-up members 80. The support arms 103a and 103b are moved toward each other and brought into contact with the lower side portions of the wafers 22. Then, the push-up rods 78 are lowered, and the wafers 22 are supported by the support arms 103a and 103b.

A wafer fork 52 of the rotary positioning arm 24, which has a pair of fixed support arms 54a, is guided under the support arms 103a and 103b. The wafer fork 52 is elevated, and the semiconductor wafers 22 supported by the support arms 103a and 103b are supported, in turn, by the wafer fork 52 of the rotary positioning arm 24.

A wafer push-up mechanism and horizontal moving mechanism will be explained below with reference to FIGS. 13 and 14.

A first wafer push-up mechanism has a fixed cylinder 201 fixed to a base frame 99. A piston rod of the fixed cylinder 201 is coupled to a push-up rod 78 and, when the piston rod is extended from the cylinder, a first group of wafers 22 is pushed up by a push-up member 80 from a corresponding carrier 48.

A second wafer push-up mechanism has a movable cylinder 202 so supported as to be movable by a horizontal moving mechanism 203. A piston rod of the movable cylinder 202 is coupled to a push-up rod 78 and, when the piston rod is extended from the movable cylinder 202, a second group of wafers 22 is pushed up by a push-up member 80 from a corresponding carrier 48. The cylinders 201 and 202 are so controlled, by a control apparatus not shown, as to bring the wafers 22 of the first group and those 22 of the second group to the same height level.

A ball screw 206 of the horizontal moving mechanism 203 is rotatably supported by a drive shaft of a motor 208 and bearing 210. The ball screw 206 extends along an X-axis direction and is brought into threaded engagement with a nut 204. The movable cylinder 202 is coupled to an upper portion of the nut 204.

Transferring 50 wafers 22 from the two carriers 48 onto a boat 56 will be explained below.

Figure 13:
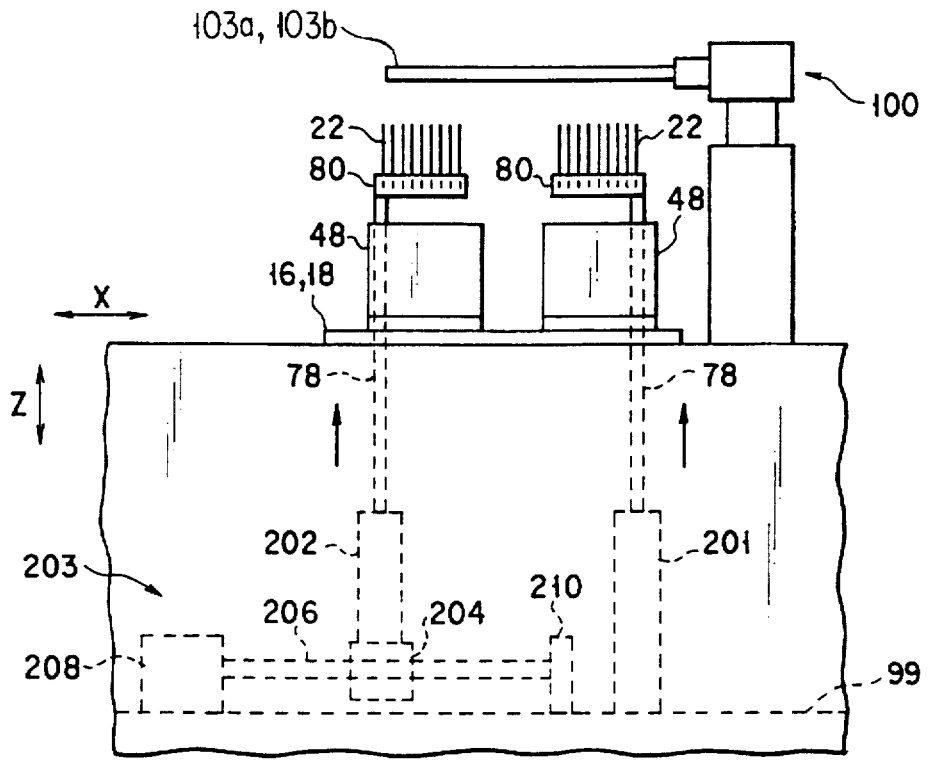
FIG. 13 is a front view showing a transfer apparatus according to another embodiment of the present invention.

As shown in FIG. 13, the first group of wafers pushed up from the one-side carrier 48 is spaced apart from the second group of wafers 22 pushed up by the other-side carrier 48, noting that 25 wafers are arranged in each of these first and second wafer groups.

Figure 14:
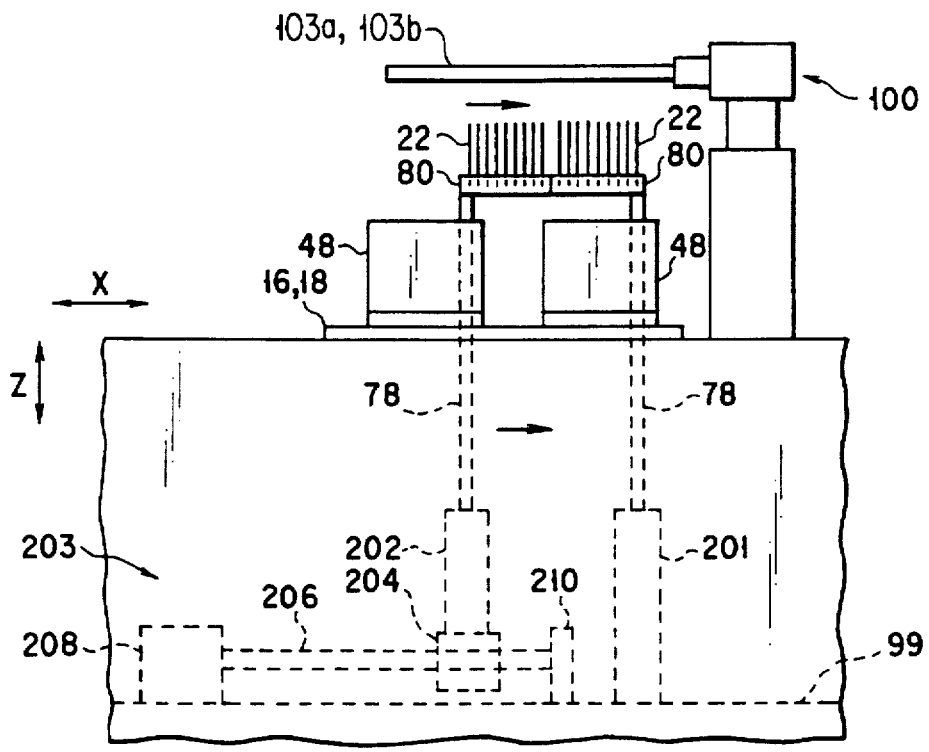
FIG. 14 is a front view showing the transfer apparatus of the present embodiment.

As shown in FIG. 14, the other-side push-up member 80 is moved by the horizontal moving mechanism 80 in the x-axis direction so as to bring the second group of wafers 22 into proximity to the first group of wafers 22. The second group of wafers 22 is stopped to a position where a distance between the rightmost wafer in the second group of wafers 22 and the leftmost wafer in the first group of wafers 22 is equal to a pitch interval of the wafers 22 in these first and second wafer groups. Then full 50 wafers 22 are picked up by a chuck device 100 from the push-up members 80, 80. These wafers 22 are transferred from the chuck device to a fork, not shown, and from there to a boat 56 not shown.

As in the first embodiment, while the semiconductor wafers 22 of the two carriers are supported on the wafer fork 52, the rotary positioning arm 24 rotates horizontally and the wafers 22 are transferred to the washing treatment bath 26, etc.

It is desirable that the support arms 54, 54a of the wafer fork 52, like the support arms 103a and 103b, be made of a material having a high resistance to chemicals, causing no damage to semiconductor wafers 22, and having a low frictional coefficient: for example, fluorine-contained resin such as Teflon, or polyether- ether-keton.

Figure 15:
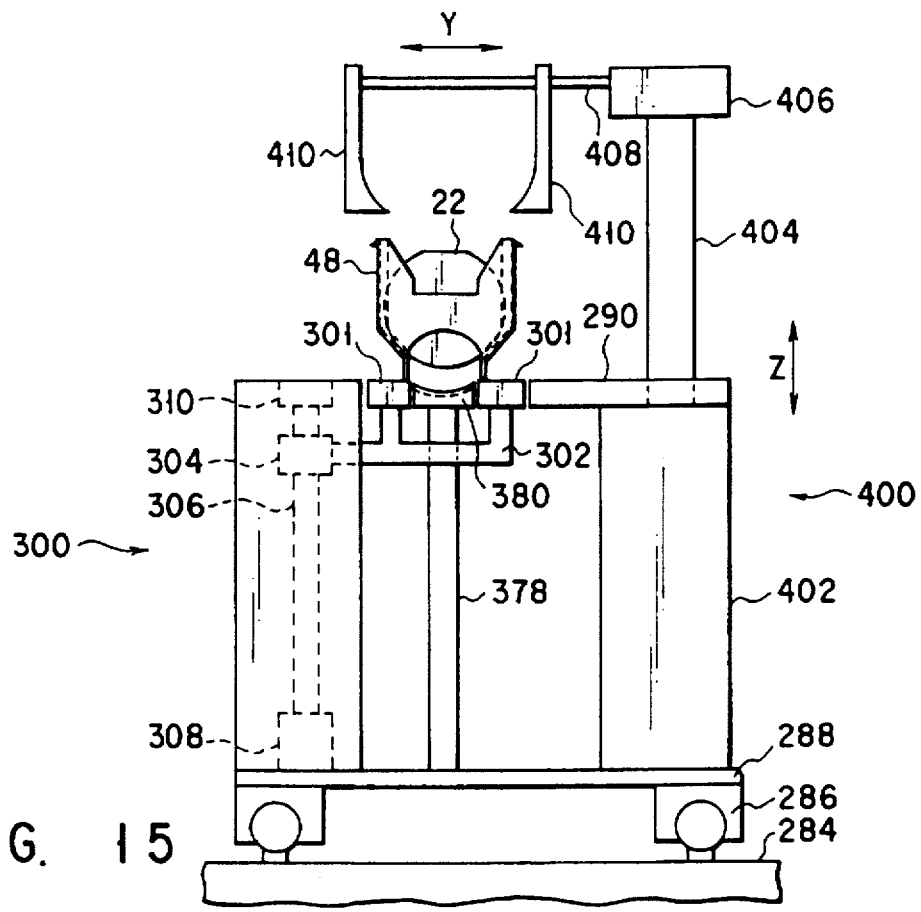
FIG. 15 is a see-through side view, partly taken away, showing a transfer apparatus according to another embodiment of the present invention.

The other embodiments of the present invention will be explained below with reference to FIGS. 15 to 17.

A carrier elevator unit 300, receiving member 380 and a wafer transfer device 400 are mounted on a base frame 288. The base frame 288 is supported from a floor 284 by means of height level adjusting/vibration preventing legs 286.

The receiving member 380 is supported by a support member 378 so as to be located flush with an upper frame 290. 50 to 80 grooves 381 are formed on the upper surface of the receiving member 380. The grooves 381 of the receiving member 380 are equal in their pitch interval to carrier grooves 48b.

A pair of carrier table members 301 are provided one at each side of the receiving member 380. The respective carrier table members 301 is coupled to an arm 302 of the carrier elevator unit 300 and the arm 302 is coupled to the ball nut 304. The ball nut 304 is threaded to a ball screw 306. The ball screw 306 extends along the Z axis direction and is connected at its lower end to a drive shaft of a motor 308 and at its upper end supported by a bearing 310 in a manner to be rotatable. The arm 302 is so positioned that it does not interfere with the support member 378.

The wafer transfer device 400 includes a lifting mechanism 402 and chuck mechanism 406. The chuck mechanism 406 is supported by a rod 404 of the lifting mechanism 402. A plurality of pairs of arms 408 of the chuck mechanism 406 are connected to one pair of chuck members 410. the pairs of chuck members 410 are opened or closed by the chuck mechanism 406.

Transferring 50 wafers 22 from two carriers 48 to a boat 56 will be explained below.

The two carriers 48 are placed on the carrier table members 301 with 25 wafers held in each carrier 48. As shown in FIG. 17, respective legs 48*d* of the carriers are placed on the corresponding carrier table members 301 and a lower opening 48*e* is located just above the receiving member 380.

Figure 17:
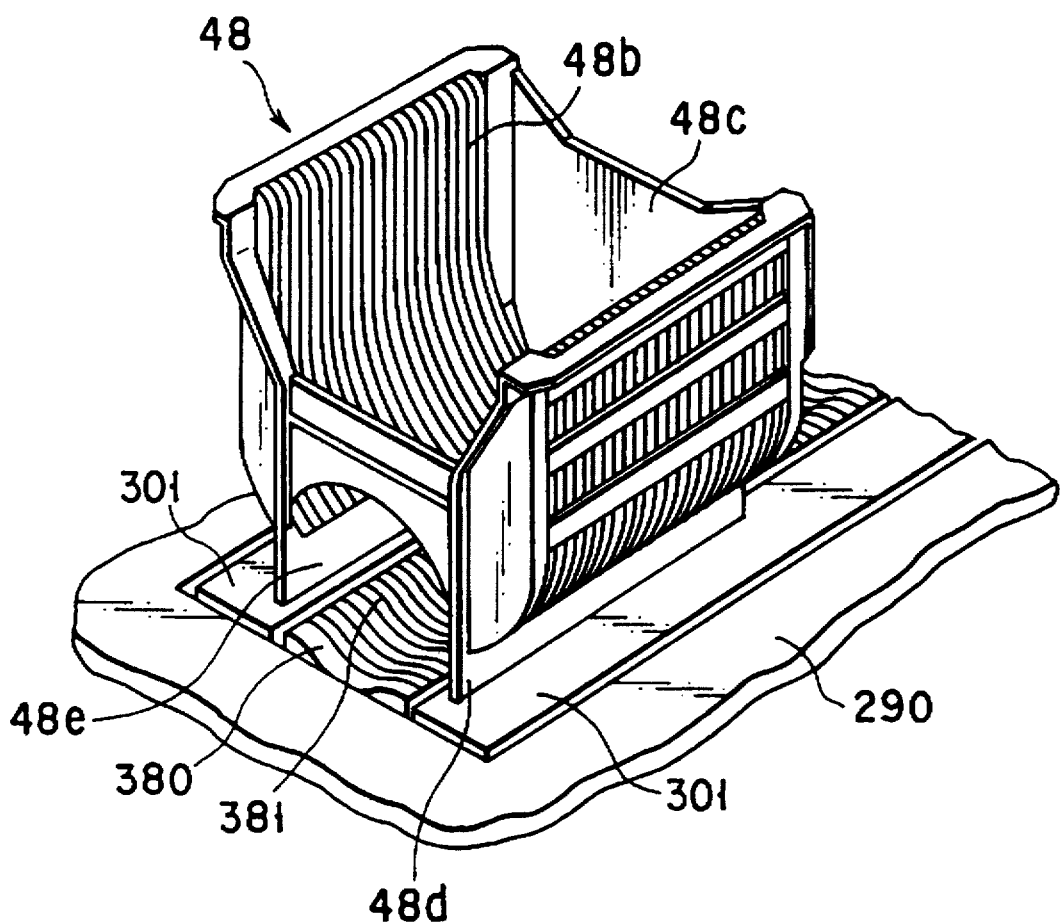
FIG. 17 is a perspective view showing a carrier on a carrier rest member of the transfer apparatus of the present embodiment.

Although only one carrier 48 is shown in FIG. 17, another carrier 48 (not shown) is arranged on the carrier table member 301.

Figure 16:
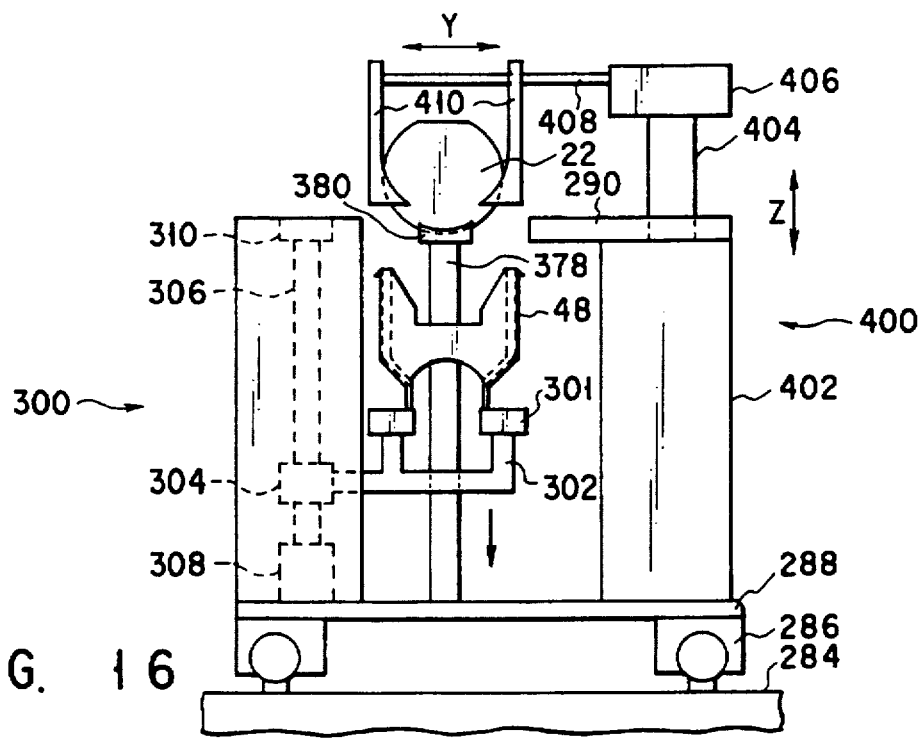
FIG. 16 is a see-through side view partly taken away, showing the transfer apparatus of FIG. 15.

When the carrier 48, together with the carrier table member 301, is lowered as shown in FIG. 16, the wafers 22 are transferred onto the receiving member 380, that is, the receiving member 380 allows the carrier 48 to be moved past its the lower opening 48*e* and upper opening 48*c* so that only the wafers 22 are received on the receiving member 380. When the carriers 48 are thus lowered and stopped to a position lower in height level than that of the upper frame 290, then the 500 wafers 22 are lifted up, by the wafer transfer device 400, at a time from the receiving member 380 and transferred from the wafer transfer device 400 to a fork (not shown) and from there to a boat 56, not shown.

A plurality of carrier table members 301 may be mutually independently and individually lifted up and lowered.

A driving means may be provided whereby, at least one of the plurality of carrier table members 301 is brought into proximity to a corresponding remaining carrier table member 301 to allow one carrier which holds a given number of wafers thereon to face the corresponding carrier holding a given number of wafers so that their mutually adjacent, directly-facing endmost wafers held in those endmost grooves of these mutually adjacent, directly-facing carriers have their mutual distance adjusted to a distance equal to a pitch distance of those wafers supported by the receiving member 380. Such driving means is of substantially the same structure as the aforementioned horizontal moving mechanism 203.

As has been described above, according to the transfer apparatus of the present invention, a number of objects supported on a plurality of carriers are pushed up to the upper part of the carriers by means of the push-up members of the push-up mechanism. In this state, the distance between the push-up members is narrowed, and the objects of the carriers are transferred to another container. Thus, the objects supported on a plurality of carriers can be transferred simultaneously. In this case, the pitch of the objects located at the mutually facing end portions of the carriers can be made closer to, or equal to, the pitch of other adjacent objects. Even in the case where the uniformity of the distance between objects affects the treatment quality, the present invention can be applied.

In addition, the distance between the adjoining end portion of each push-up member and the object situated at the adjoining end portion is set to be half the distance between other adjacent objects, all the objects can be arranged equidistantly.

Furthermore, the mutually adjoining end portions of push-up members are provided with ridges and grooves which are to be intermeshed. When the ridges and grooves of the adjoining end portions are intermeshed, the distance between the objects situated at the end portions is set to be equal to the distance between other adjacent objects. Thereby, while the distance between the objects situated at the end portions can be made equal to the distance between other adjacent objects, the adjoining end portions of the push-up members can be reinforced.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A transfer apparatus for transferring a plurality of substrates between carriers and a support member, the carriers holding the substrates in an equidistant manner, the transfer apparatus comprising:

a carrier table for arranging a plurality of said carriers arranged in a serial array so as to hold the substrates mutually parallel to each other;

a plurality of push-up members, each of said push-up members being adapted to be moved below each of said carriers, wherein a push-up mechanism for each of said push-up members pushes up said substrates supported on the carriers through a lower opening portion of each of said carriers to a position higher than the carrier table, each of said push-up members having an upper surface with a plurality of equidistantly spaced grooves for receiving and lifting all of the substrates supported in one carrier as a whole; and driving means for bringing at least one of the plurality of push-up members into proximity to a corresponding remaining push-up member to allow the at least one push-up member to be adjacent to and face the corresponding push-up member so that mutually adjacent, directly-facing endmost substrates held in endmost grooves of the adjacent, directly-facing push-up members have a mutual distance between them which is adjusted to a distance equal to a pitch distance of those substrates supported by the push-up member, wherein all the equidistantly arranged substrates lifted by the plurality of the push-up members are transferred at a time from the push-up members to the support member.

2. The transfer apparatus according to claim 1, wherein two push-up members are provided, only one of which is so coupled to the driving means so as to be horizontally moved to enable said one push-up member to be brought into proximity to the other push-up member.

3. The transfer apparatus according to claim 1, wherein said support member has a pair of arms each supported at one end, and said push-up members include two members consisting of one member which can be moved in a horizontal direction by said driving means and is positioned closer to a distal end of said arms than the other member.

4. The transfer apparatus according to claim 1, wherein a pitch of the grooves formed in each push-up member is equal to a pitch of the grooves formed in the carrier.

5. The transfer apparatus according to claim 1, wherein each push-up member is provided with the same number of grooves which are formed equidistantly.

6. The transfer apparatus according to claim 1, wherein 50 to 80 grooves are equidistantly formed in each push-up member.

7. The transfer apparatus according to claim 1, wherein said push-up mechanisms bring said push-up members to substantially the same height.

\* \* \* \* \*